(12) United States Patent
Hirota et al.

(10) Patent No.: US 7,643,304 B2
(45) Date of Patent: Jan. 5, 2010

(54) FILTER APPARATUS AND FREQUENCY CONVERTER TO WHICH THE FILTER APPARATUS IS CONNECTED

(75) Inventors: Masayuki Hirota, Narashino (JP); Satoshi Ibori, Yatimata (JP); Naoki Takata, Narashino (JP); Masahiro Hiraga, Yotsukaidou (JP)

(73) Assignee: Hitachi Industrial Equipment Systems Co., Ltd., Chiba (JP)

( * ) Notice: Subject to any disclaimer, the term of this patent is extended or adjusted under 35 U.S.C. 154(b) by 816 days.

(21) Appl. No.: 10/985,943

(22) Filed: Nov. 12, 2004

(65) Prior Publication Data

US 2005/0126811 A1    Jun. 16, 2005

(30) Foreign Application Priority Data

Nov. 14, 2003    (JP)    ............................... 2003-384487

(51) Int. Cl.
  *H05K 7/00*    (2006.01)
(52) U.S. Cl. .................... 361/728; 361/601; 361/679; 361/707
(58) Field of Classification Search ................ 361/728, 361/309, 600, 601, 679, 701, 707
  See application file for complete search history.

(56) References Cited

U.S. PATENT DOCUMENTS

| | | | | |
|---|---|---|---|---|
| 4,455,538 A | * | 6/1984 | Kinzler | ....................... 333/167 |
| 4,464,702 A | | 8/1984 | Miller et al. | |
| 4,908,757 A | * | 3/1990 | Jensen et al. | ................ 363/141 |
| 5,091,823 A | * | 2/1992 | Kanbara et al. | ............. 361/697 |
| 5,277,625 A | * | 1/1994 | Iannella et al. | ......... 439/620.11 |
| 5,397,250 A | * | 3/1995 | Briones | ................. 439/620.17 |
| 6,320,776 B1 | | 11/2001 | Kajiura et al. | |
| 6,364,923 B1 | * | 4/2002 | Wiedmeyer et al. | ........ 55/385.2 |
| 6,381,153 B1 | * | 4/2002 | Brussels | ....................... 363/39 |
| 6,437,993 B1 | * | 8/2002 | Burgdorf et al. | ............ 361/818 |
| 6,473,291 B1 | * | 10/2002 | Stevenson | ................ 361/306.3 |
| 6,563,707 B1 | * | 5/2003 | Engler et al. | ................ 361/695 |
| 6,803,726 B2 | * | 10/2004 | Yang | ........................ 315/39.51 |
| 6,803,746 B2 | * | 10/2004 | Aker et al. | ................... 320/139 |

(Continued)

FOREIGN PATENT DOCUMENTS

| | | |
|---|---|---|
| JP | 8-308250 | 11/1996 |
| JP | 08-330188 | 12/1996 |
| JP | 11-298184 | 10/1999 |
| JP | 2000-195748 | 7/2000 |
| WO | WO 93/13587 | 7/1993 |

*Primary Examiner*—Dean A. Reichard
*Assistant Examiner*—Xiaoliang Chen
(74) *Attorney, Agent, or Firm*—Antonelli, Terry, Stout & Kraus, LLP.

(57) ABSTRACT

The invention provides a technique and a product in which for a frequency converter supplying electric power to, for example, a motor, a downsizing, lightening or the like of the frequency converter is realized while providing a filter apparatus reducing electromagnetic noises and the like. The filter apparatus reducing electromagnetic noises and the like is provided near a main circuit terminal board of the frequency converter, and the filter apparatus is connected directly to a main circuit terminal as a wiring drawing portion of the frequency converter. Part of a housing of the frequency converter and part of a filter housing are fitted to each other to fix the filter housing to the frequency converter.

11 Claims, 7 Drawing Sheets

U.S. PATENT DOCUMENTS

| | | | |
|---|---|---|---|
| 6,822,866 B2 * | 11/2004 | Fearing et al. | 361/701 |
| 7,042,198 B2 * | 5/2006 | Mutoh | 323/205 |
| 7,250,109 B2 * | 7/2007 | Lennartz et al. | 210/333.01 |
| 7,289,329 B2 * | 10/2007 | Chen et al. | 361/707 |
| 7,317,626 B2 * | 1/2008 | Azuma et al. | 363/144 |
| 2003/0179594 A1 * | 9/2003 | Bruckmann et al. | 363/132 |

* cited by examiner

FILTER APPARATUS AND FREQUENCY CONVERTER TO WHICH THE FILTER APPARATUS IS CONNECTED

INCORPORATION BY REFERENCE

The present application claims priority from Japanese application JP2003-384487 filed on Nov. 14, 2003, the content of which is hereby incorporated by reference into this application.

BACKGROUND OF THE INVENTION

The present invention relates to a technique for reducing noises of a frequency converter supplying electric power to, for example, a motor.

PRIOR ART

For specifications regarding electromagnetic noises in the frequency converter, performance characteristics for which the CE mark can be labeled, EN55011 (Class A, Class B) and EN61800 are known. The specifications and the like are described for specifying limit values of electromagnetic noises according to apparatuses used and classes of use environments to prevent influences on other electrical apparatuses.

Techniques regarding measures against noises as described above include, for example, the technique disclosed in Patent Document 1.

[Patent Document 1] JP-A-8-308250

In measures against noises, a filter apparatus reducing electromagnetic noises and the like is generally provided. However, if the filter apparatus is provided, a mounting space is required accordingly, and the drawing of wiring and the like for connecting the filter apparatus should be considered.

In view of the matters described above, the object of the present invention is to provide a filter apparatus reducing electromagnetic noises and the like for a frequency converter supplying electric power to, for example, a motor, and to realize a downsizing and the like of the frequency converter or filter apparatus while connecting the filter apparatus to the frequency converter.

BRIEF SUMMARY OF THE INVENTION

The present invention solves the above problem as follows. A filter apparatus reducing electromagnetic noises and the like is provided near a wiring drawing portion of a main circuit terminal board of a frequency converter.

The filter apparatus is connected to the wiring drawing portion of the main circuit terminal board.

Part of a housing of the frequency converter and part of a filter housing are fitted to each other to fix the filter housing on the frequency converter.

Characteristics of the filter apparatus may be defined as not having influences such as electromagnetic noises on other electric apparatuses based on performance characteristics for which the CE mark can be labeled, EN55011 and the specification of EN61800, for example.

Particularly, the specification of EN61800 and EN55011 (Class A, Class B) included in the specification of EN 61800 are generally well known in the frequency converter and the like.

Thus, as a filter apparatus reducing electromagnetic noises and the like, the filter apparatus may be configured to have characteristics of filter apparatus based on the specification of EN61800 and EN55011 (Class A, Class B) included in the specification of EN61800.

According to the present invention, a product having good characteristics can be provided as to reduction of noises of the frequency converter. Alternatively, a frequency converter having a reduced size while achieving a reduction in noises can be provided.

DETAILED DESCRIPTION OF THE INVENTION

An electromagnetic noise filter as a filter apparatus reducing electromagnetic noises in Example according to the present invention, or a frequency converter to which the filter apparatus is connected will be described in detail below using Example shown in figures.

Figure 1:
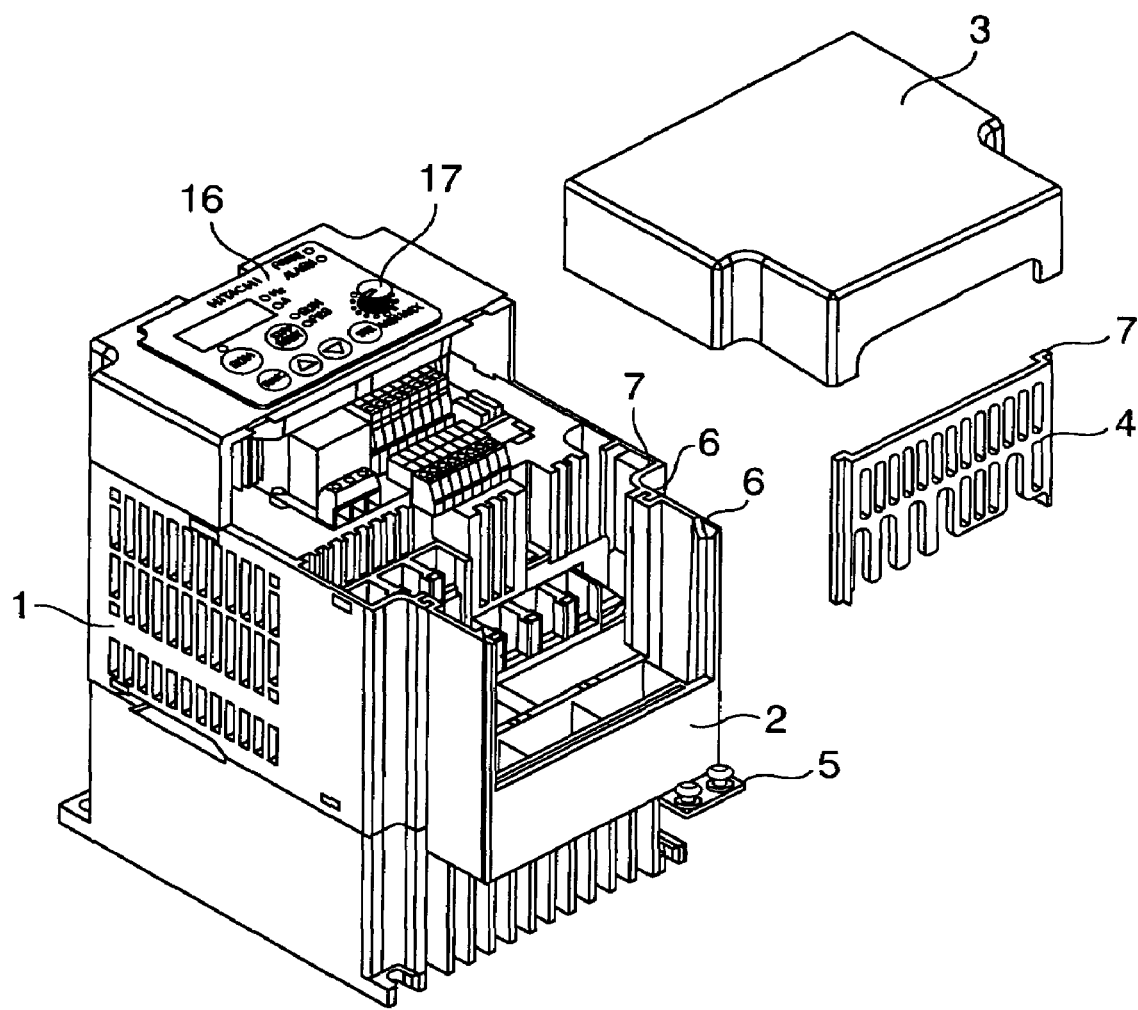
FIG. 1 shows an example of a frequency converter having an electromagnetic noise filter mounted thereon.

FIG. 1 shows an implementation of the electromagnetic noise filter as Example according to the present invention. In the figure, reference numeral 1 denotes a frequency converter housing, reference numeral 2 denotes an electromagnetic noise filter case, reference numeral 3 denotes a terminal board cover, reference numeral 4 denotes a wiring drawing plate, and reference numeral 5 denotes an earth bar for frequency converters. The frequency converter housing 1 is provided with a groove 6 for mounting the wiring drawing plate 4, and the wiring drawing plate 4 is provided with a raised portion 7. The electromagnetic noise filter case 2 is also provided with the raised portion 7. If no filter is required, the electromagnetic noise filter case 2 can be removed to fit the wiring drawing plate 4 directly into the groove 6 provided in a case of the frequency converter 1.

Figure 7:
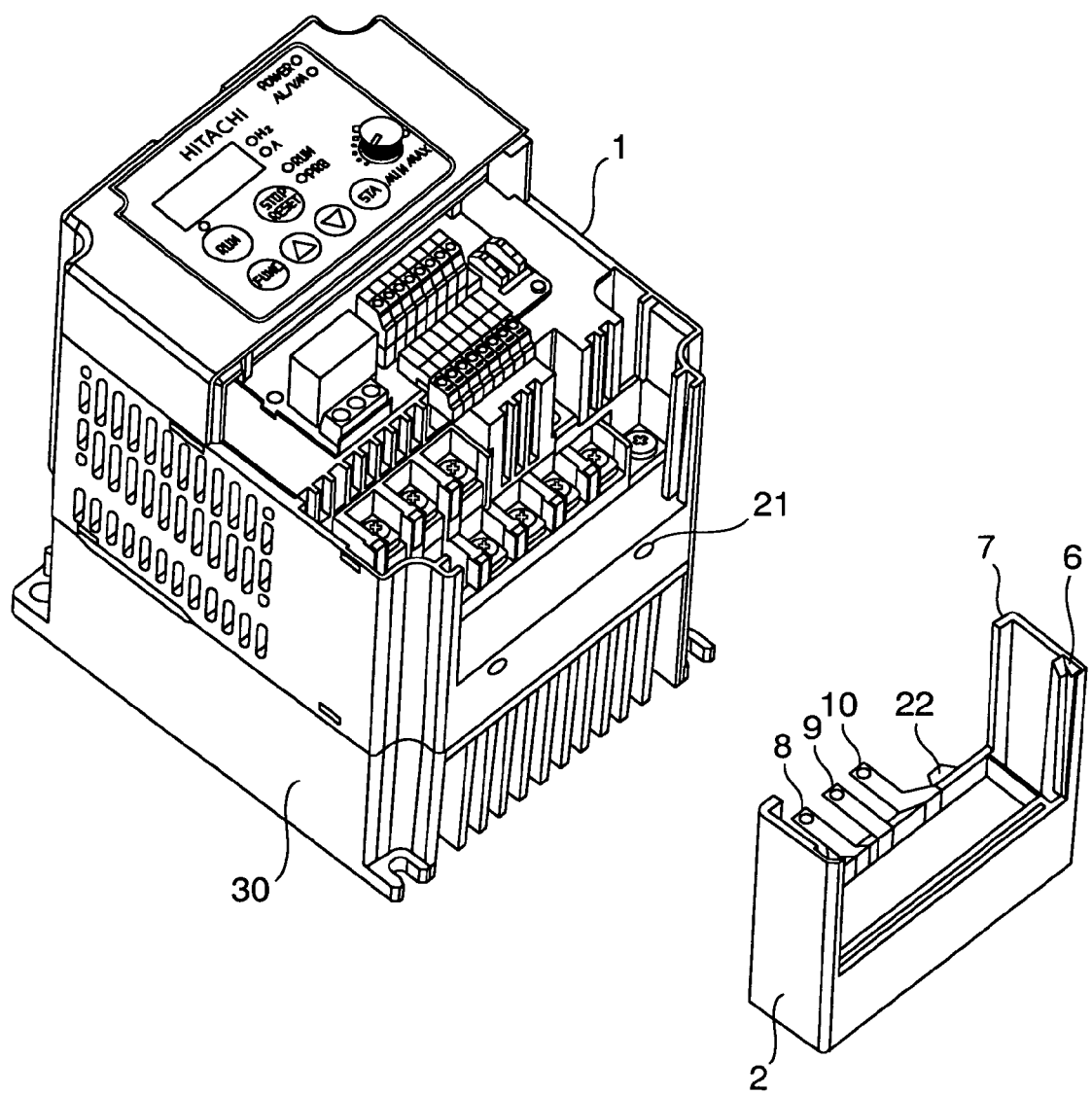
FIG. 7 shows an example of another method for mounting the electromagnetic noise filter.

Attachment/detachment can be eased by providing a raised portion 22 on the side face of the electromagnetic noise filter case 2 and providing a recessed portion 21 on the side face of the frequency converter housing 1 as shown in FIG. 7. The recessed portion 21 is a hole-like portion provided on the side face of the frequency converter housing 1, and the raised portion 22 is a protruding portion provided on the side face of the electromagnetic noise filter case 2. The recessed portion 21 and the raised portion 22 are fitted to or engaged with each other to fix the electromagnetic noise filter case 2 to the frequency converter housing 1.

In the configuration shown in FIG. 1, the frequency converter housing 1 and the filter housing of the electromagnetic noise filter case 2 are fitted to each other to fix the electromagnetic noise filter to the frequency converter. For this purpose, a fitting portion fitting part of the frequency converter housing 1 and the filter housing of the electromagnetic noise filter case 2 to each other is provided in each housing.

In FIG. 1, the recessed groove 6 for mounting the wiring drawing plate 4 in the frequency converter housing 1 or the raised portion 7 in the electromagnetic noise filter case 2 is the fitting portion. However, the fitting portion is not limited to the specific shape of the recessed groove 6 or raised portion 7, but may have any different shape as appropriate as long as it allows the frequency converter housing 1 to be fixed to the filter housing of the electromagnetic noise filter case 2.

Example of fixation by fitting has been described above, but fixation is not limited thereto, and part of the frequency converter housing 1 and part of the filter housing of the electromagnetic noise filter case 2 may be interlocked or engaged with each other for fixation. In this case, an interlocking portion interlocked with part of each housing or an engagement portion engaging parts of the housings with each other is provided.

If a filter having better characteristics or a filter having a larger size is required for making the filter compliant with a higher specification in terms of the specification, the attached filter can be removed to attach a filter for the specification with ease in the manner described above.

Figure 2:
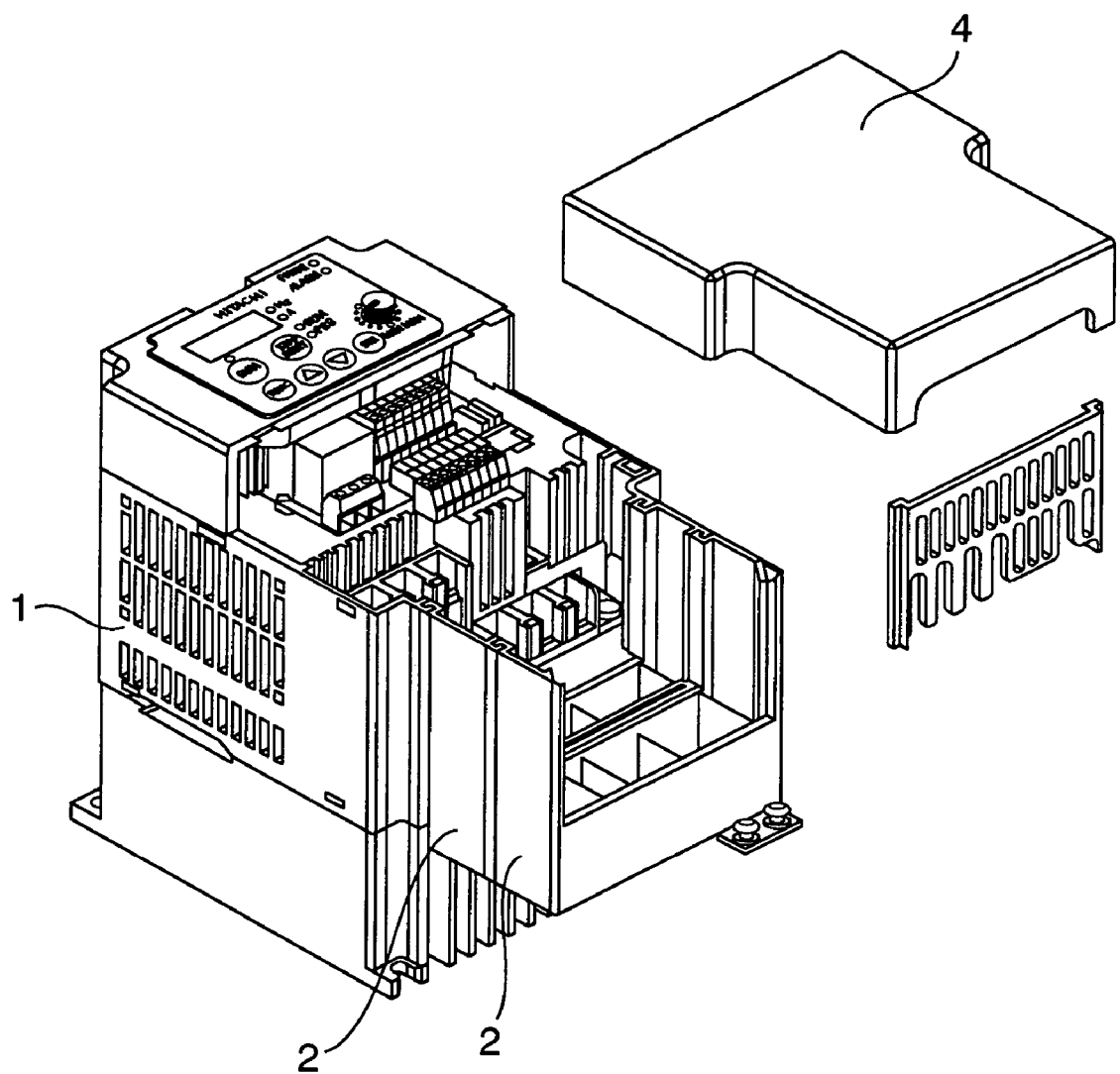
FIG. 2 shows another example of the frequency converter having the electromagnetic noise filter mounted thereon.

Alternatively, a noise filter effect can be increased by coupling together electromagnetic noise filter cases 2 having the same shape as shown in FIG. 2. In this case, the fitting portion composed of the recessed portion 21 and the raised portion 22 is provided in the electromagnetic noise filter case 2, thus making it possible to couple together electromagnetic noise filter cases 2 at the fitting portion composed of the recessed portion 21 and the raised portion 22.

The coupled noise filter cases may be different in size, thickness, characteristics of filters, contained condensers, electronic parts constituting the filter, and the like. However, by equalizing the outer dimensions of electromagnetic noise filter cases, the overall dimensional and the like as the frequency converter can be approximately estimated to afford convenience during installation in equipment as a matter of course.

A fixing screw for installing the electromagnetic noise filter is not required because the groove 6 provided originally for use in the frequency converter is used, and thus the need for screws can be eliminated for fixation.

However, for fixing the electromagnetic noise filter case 2 to the frequency converter housing 1, a screw may be used, or an adhesive or Hook-and-Loop fastener (detachable plane fastener with a hook shape and a pile shape interlocked) may be used.

In this case, positioning for positioning the electromagnetic noise filter case 2 at a predetermined location in the frequency converter housing 1 can be considered. For example, a positioning portion is provided in part of the frequency converter housing 1, and the electromagnetic noise filter case 2 is positioned based on the positioning portion and is then fixed with the screw or the like, whereby efficiency of fixation work and the like can be improved.

For the positioning portion, a portion such as the recessed portion 21 or raised portion 22 described with FIG. 2 may be used as a positioning portion. Alternatively, positioning may be done by protruding a heat dissipation fin 30 shown in FIG. 7 by a predetermined length relative to the frequency converter housing 1 and abutting part of the electromagnetic noise filter case 2 against the protruding portion. Of course, positioning may be done by providing a protruding portion in part of the frequency converter housing 1 and abutting part of the electromagnetic noise filter case 2 against the protruding portion.

The location in the frequency converter housing 1 at which the electromagnetic noise filter case 2 is mounted, shown in FIG. 1, is a location at which a space must be usually provided for wiring to the frequency converter such as main circuit wiring. For this reason, it is not required to provide a space for mounting the electromagnetic noise filter case in the frequency converter housing 1.

Thus, the frequency converter housing 1 is never upsized even if the electromagnetic noise filter case is mounted. The shape of the frequency converter housing 1 should not be changed between a type of frequency converter in which the electromagnetic noise filter case is mounted and a type of frequency converter in which electromagnetic noise filter case is not mounted. That is, regardless of whether the electromagnetic noise filter case is mounted or not, the shape of the frequency converter housing 1 can be equalized. This contributes to reduction in costs for moldings that are used during production of the frequency converter housing 1, and the like.

Figure 3:
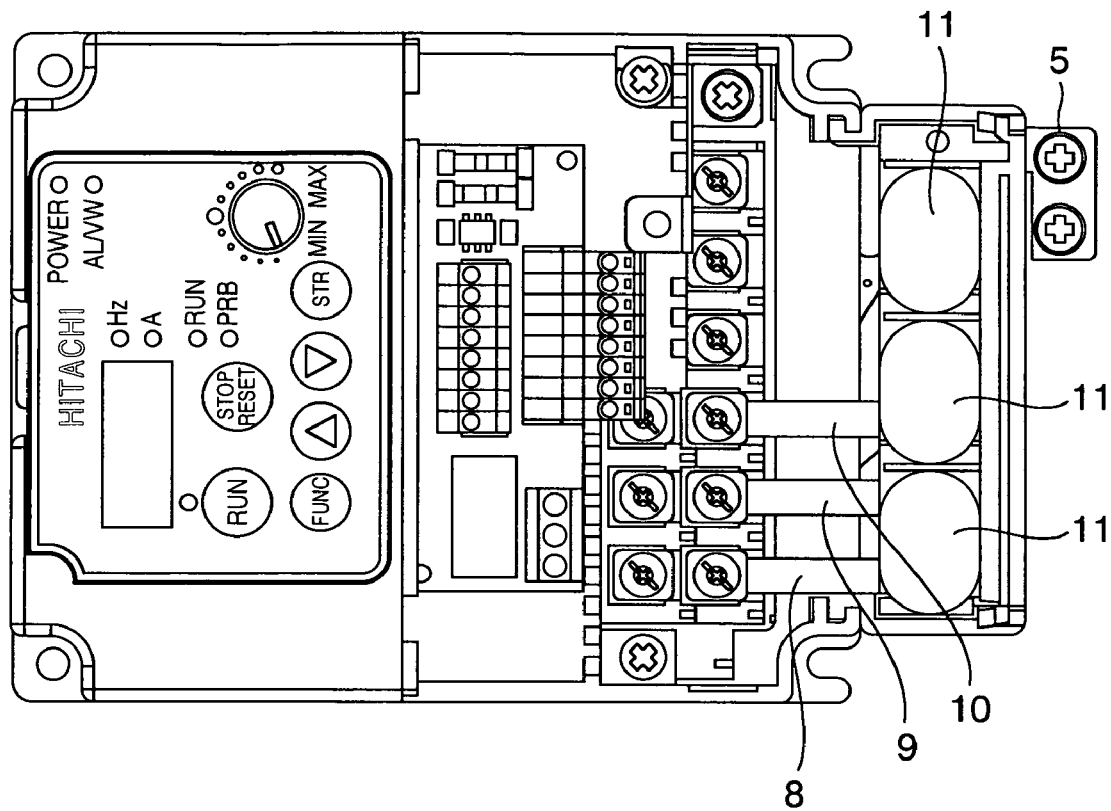
FIG. 3 shows Example of the present invention (plan view)

A view seen from the top is shown in FIG. 3. From the electromagnetic noise filter case 2, terminals 8, 9 and 10 are connected to input terminals R, S and T, respectively. The terminals 8, 9 and 10 are made of conductive materials such as metals such as copper, aluminum and copper-nickel alloys.

The terminals 8, 9 and 10 are made of thin metal and therefore, even if a slight difference in height occurs during connection to a terminal board provided in the frequency converter 1, the material is warped and deformed to make connection easy. The terminals 8, 9 and 10 are conductive plates in the figure, but the same effect can be obtained if they are wire rods.

Figure 6:
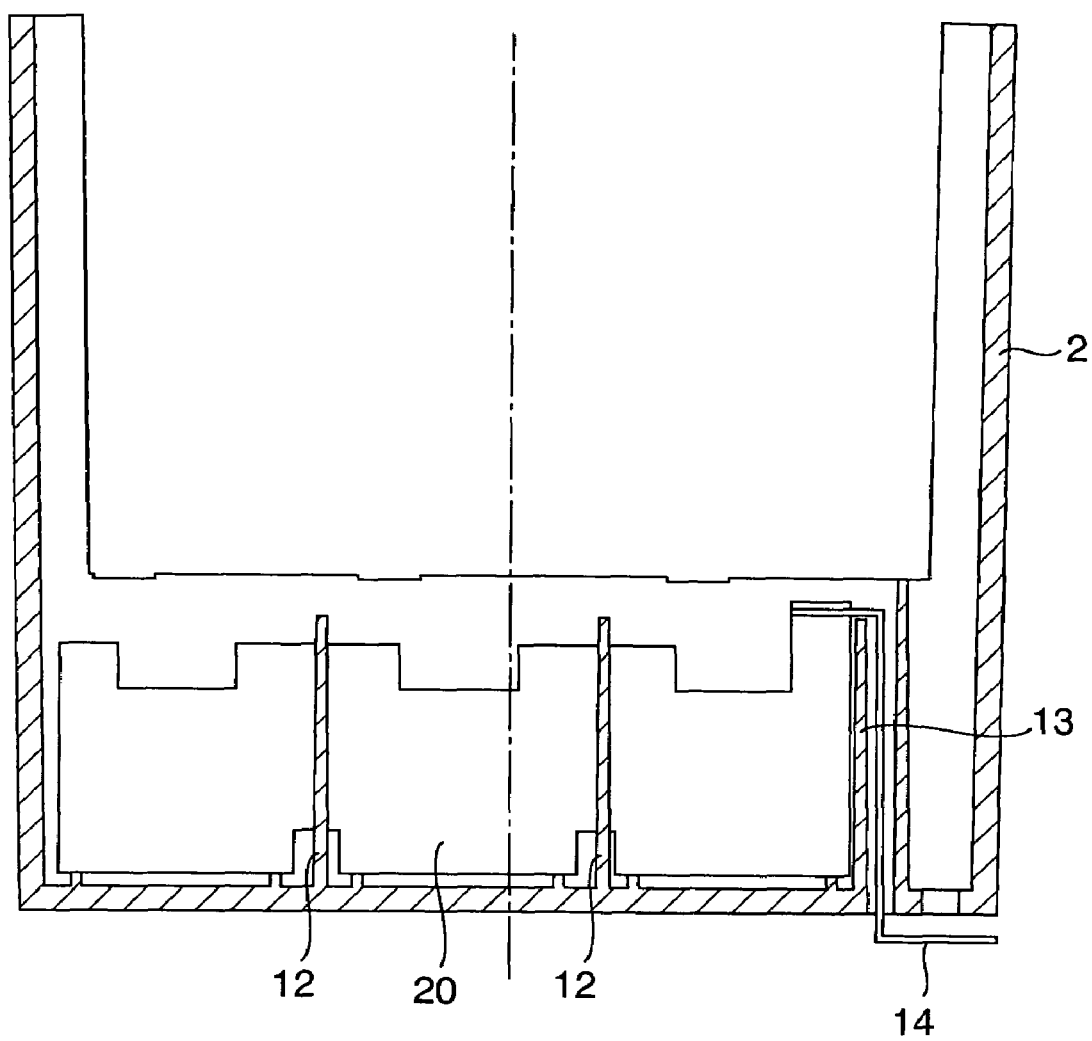
FIG. 6 shows Example of the electromagnetic noise filter (another sectional view)

A sectional view of the electromagnetic noise filter case is shown in FIG. 6. Another sectional view of the electromagnetic noise filter case is shown in FIG. 7. Inside the electromagnetic noise filter case 2, a filter condenser 11 is placed and walls 12 and 13 for partitioning the filter condenser 11 are provided. The filter condenser 11 is usually covered with a resin 23 of plastic as a sealing agent for ensuring improvement in moisture resistance and heat resistance and an insulation distance specified in the specification, and is thus unseen after assembly.

Usually, the filter condenser 11 that is used in Example does not have a case that is provided when the condenser is formed. A usual condenser has electronic parts composed of metal plates and an insulator or the like as a dielectric material held between the metal plates covered with a condenser case. In Example, the electronic part composed of metal plates and an insulator or the like as a dielectric material held between the metal plates is placed directly in the noise filter case 2 and covered with the resin 23 of plastic. With this configuration, the filter can be downsized and lightened as a whole because the usual condenser is absent.

A groove 15 through which an earth bar 14 for filter condenser connected to the earth bar 5 for frequency converter passes. The wall 13 provided near the groove 15 is made to be little taller than the wall 12 partitioning the condenser 11, whereby the resin of plastic is prevented from flowing into the groove 15 even if a low-viscosity plastic resin is used when the filter condenser 11 is covered with the resin 23 of plastic. As a result, even if a low-viscosity resin not requiring a degassing apparatus or the like is used, the plastic resin is never leaked from the groove into which the earth bar 14 being a connection conductor on the ground side is fitted, and thus workability is improved.

When a high-viscosity plastic resin is used, the groove 15 is made to have an appropriate size, whereby the plastic resin used for sealing the filter condenser 11 is never leaked from the groove 15 owing to the viscosity of the plastic resin, thus making it possible to eliminate the need for the wall 13.

The earth bar 5 for frequency converter and the earth bar 14 for filter condenser are connected directly on the undersurface of the electromagnetic noise filter case 2, or connected through a conductor plate or wire rod. As in the connection form described above, the connection conductor on the ground side of the electromagnetic noise filter case 2 should be connected to the connection conductor on the installation side of the frequency converter at a shortest possible distance.

The conductor plate 20 grounding the filter condenser 11 on the ground side inside the electromagnetic noise filter case 2 is placed along the inner wall of the electromagnetic noise filter case 2, whereby electromagnetic noises generated in the electromagnetic noise filter case 2 can be blocked.

A volume control knob 17 placed in the frequency converter 1 and provided in a digital operator 16 can easily be attached and detached.

Figure 4:
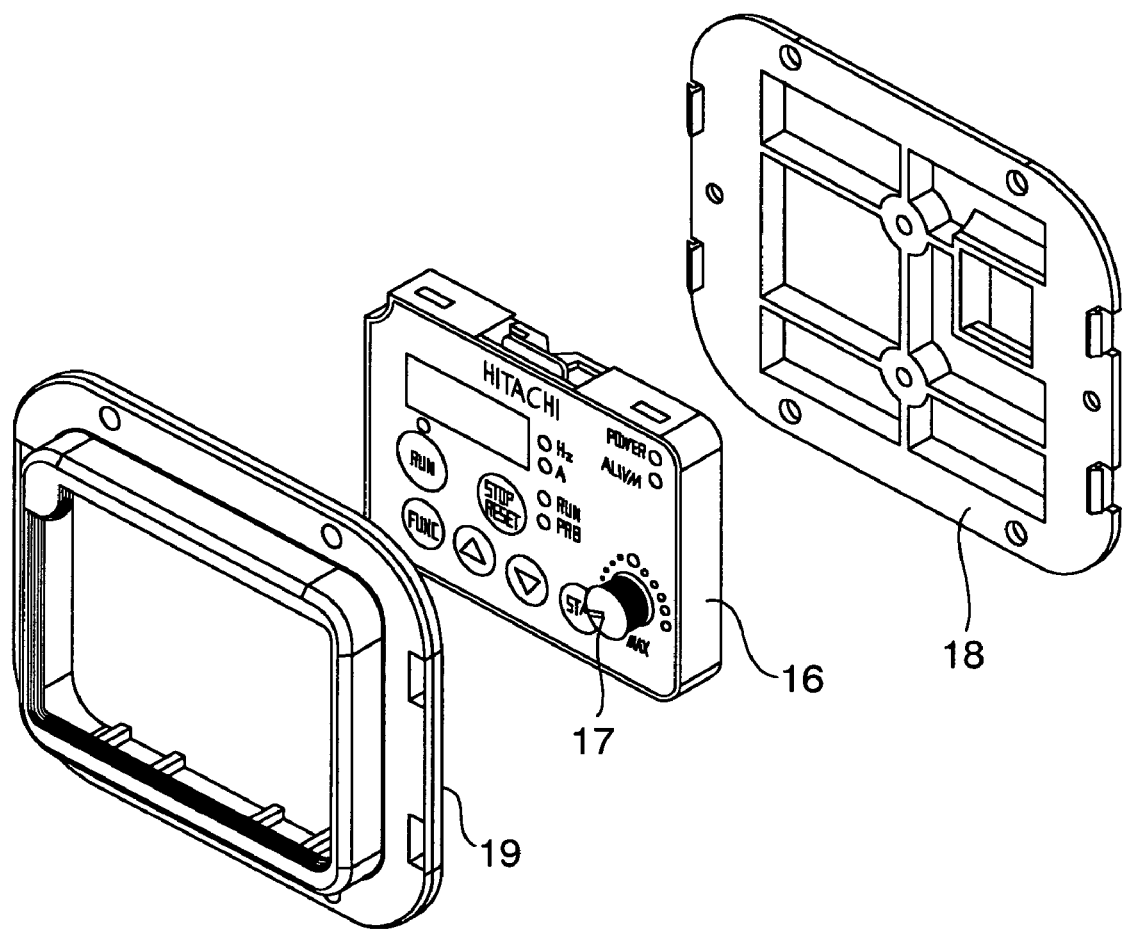
FIG. 4 shows Example of a waterproof case of a digital operator.
Figure 5:
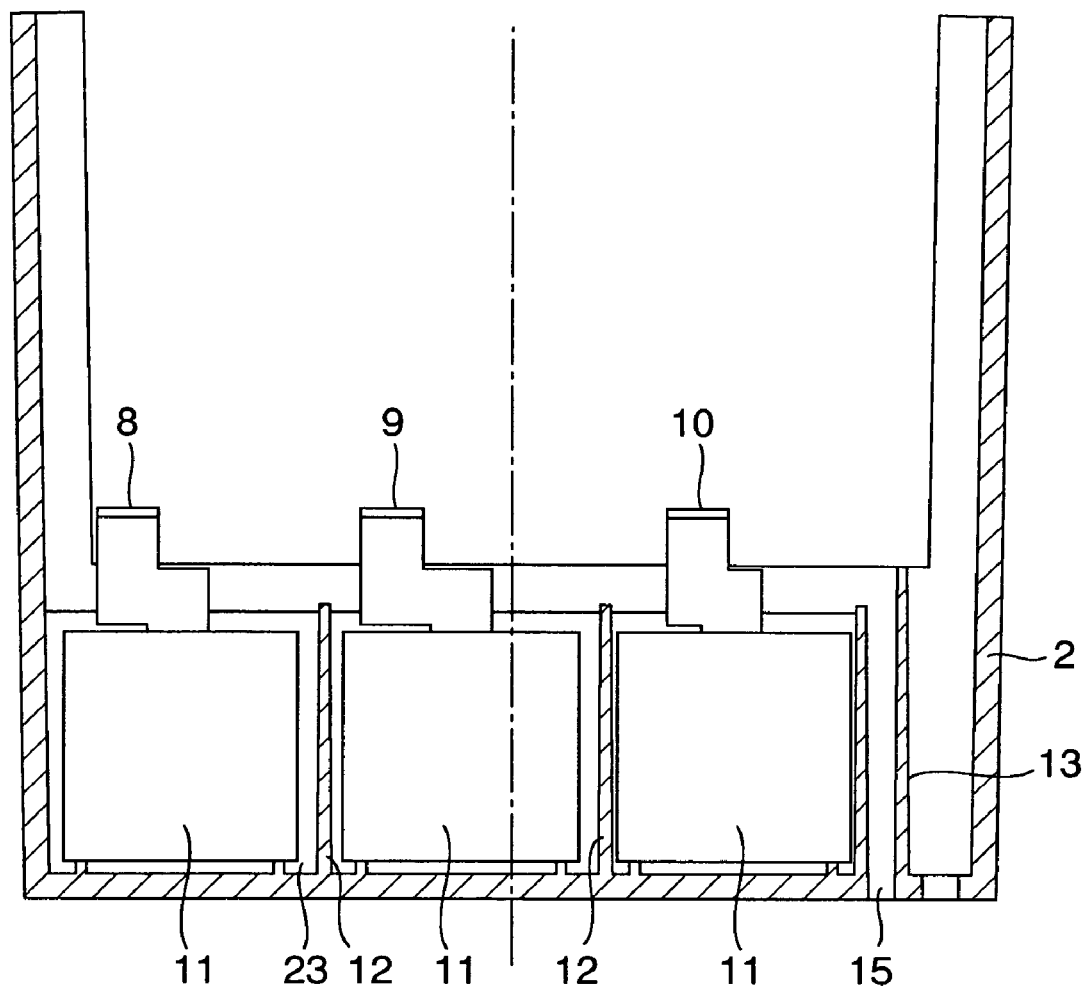
FIG. 5 shows Example of the electromagnetic noise filter (sectional view)

The digital operator 16 is held between a waterproof cover 19 and a waterproof case 18 as shown in FIG. 4, whereby waterproof measures can be made.

The filter apparatus and the frequency converter in the Example described above may be, for example, distributed, sold, and transferred in the market and the like with each of them as a single product. Alternatively, they may be, for example, distributed, sold and transferred in the market and the like as the frequency converter with the filter apparatus connected thereto, i.e. in an integrated state.

For a condenser element that is used in the filter apparatus in the Example described above, a condenser element having an electronic part having an insulator as a dielectric material held between conductor plates can be used.

Characteristics of the filter apparatus may be defined as not having influences such as electromagnetic noises on other electrical apparatuses and the like based on, for example, the CE specification, EN55011 and the specification of EN61800.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A filter apparatus connected to a wiring drawing portion of a power converter, said filter apparatus comprising:
   a condenser element having an electronic part having an insulator as a dielectric material held between metal plates;
   a sealing agent sealing said condenser element;
   a filter circuit comprising said condenser element;
   a connection conductor establishing wiring connections of said filter circuit; and
   a filter housing supporting said sealing agent,
   wherein the filter housing is provided with a fitting portion which is fitted to part of said power converter, and an apertural area opening facing said wiring drawing portion,
   said connection conductor is composed of flexible metal and has a terminal connected with said wiring drawing portion of said power converter through said apertural area, and the connection conductor on a side of an installation electric pole located on the opposite side having a nip at said terminal and said condenser element, and when connecting with said fitting portion, an earth electrode of the power converter and the connection conductor on the side of said earth electrode are connected.

2. The filter apparatus according to claim 1, wherein the connection conductor drawn from a side opposite to a side on which the connection conductor is connected to the wiring drawing portion of said frequency converter is connected to the frequency converter on the ground electrode side.

3. The filter apparatus according to claim 1, wherein said connection conductor covers part of the side face inside said filter housing.

4. The filter apparatus according to claim 1, wherein a wail for preventing said sealing agent from flowing out from a hole for taking the connection conductor on the ground side which is connected to said frequency converter on the ground electrode side is provided.

5. The filter apparatus according to claim 4, wherein if said sealing agent has a high viscosity, a wall for preventing said sealing agent from flowing out from a hole for taking the connection conductor on the ground side which is connected to said frequency converter on the ground electrode side is not provided.

6. The filter apparatus according to claim 1 wherein part of a housing of said frequency converter and part of the filter housing are fitted to each other to fix said filter housing to said frequency converter.

7. The filter apparatus according to claim 1, wherein the filter housing is provided with a raised portion fitted to a recessed groove in part of the housing of said frequency converter.

8. The filter apparatus according to claim 1, wherein the filter housing is provided with a recessed groove fitted to a raised portion in part of the housing of said frequency converter.

9. The filter apparatus according to claim 1, wherein characteristics of said filter apparatus are based on Class A of EN55011, Class B of EN55011 or the specification of EN61800.

10. A modular filter package removably-connectable to a housing of a power converter, the filter package comprising:
    a filter package housing removably-connectable to the housing of the power converter, a portion of the filter package housing engaging a mating portion of the housing of the power converter and serving to align electrical interconnections between the filter package and the power converter;
    a condenser element having an electronic part having an insulator as a dielectric material held between metal plates, provided in the filter package housing;
    a sealing agent sealing the condenser element in the filter package housing;
    a filter circuit provided in the filter package housing and including the condenser element; and,
    a connection conductor establishing wiring connections of the filter circuit to a wiring drawing portion of the power converter, as the electrical interconnections;
    wherein the filter package housing has an apertural area opening facing the wiring drawing portion of the power converter, and
    the connection conductor is composed of flexible metal and has a terminal connected with the wiring drawing portion of the power converter through the apertural area, and the connection conductor on a side of an installation electric pole located on the opposite side having a nip at the terminal and the condenser element, and when removably-connecting the filter package housing with the housing of the power converter, an earth electrode of the power converter and the connection conductor on the side of the earth electrode are connected.

11. A modular filter package removably-connectable to a housing of a power converter, the filter package comprising:

a filter package housing removably-connectable to the housing of the power converter by replacing a removable plate provided on the housing of the power converter, a portion of the filter package housing engaging a mating portion of the housing of the power converter and serving to align electrical interconnections between the filter package and the power converter, the filter package housing further having an opening for receiving and holding the removable plate removed from the housing of the power converter;

a condenser element having an electronic part having an insulator as a dielectric material held between metal plates, provided in the filter package housing;

a sealing agent sealing the condenser element in the filter package housing;

a filter circuit provided in the filter package housing and including the condenser element; and, a connection conductor establishing wiring connections of the filter circuit to a wiring drawing portion of the power converter, as the electrical interconnections;

wherein the filter package housing has an apertural area opening facing the wiring drawing portion of the power converter, and the connection conductor is composed of flexible metal and has a terminal connected with the wiring drawing portion of the power converter through the apertural area, and the connection conductor on a side of an installation electric pole located on the opposite side having a nip at the terminal and the condenser element, and when removably-connecting the filter package housing with the housing of the power converter, an earth electrode of the power converter and the connection conductor on the side of the earth electrode are connected.

* * * * *